United States Patent
Aoyagi et al.

(10) Patent No.: US 11,653,439 B2
(45) Date of Patent: May 16, 2023

(54) GROUND MEMBER AND SHIELDED PRINTED WIRING BOARD

(71) Applicant: Tatsuta Electric Wire & Cable Co., Ltd., Higashiosaka (JP)

(72) Inventors: Yoshihiko Aoyagi, Kizugawa (JP); Kenji Kamino, Kizugawa (JP); Yuusuke Haruna, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 17/299,115

(22) PCT Filed: Dec. 3, 2019

(86) PCT No.: PCT/JP2019/047104
§ 371 (c)(1),
(2) Date: Jun. 2, 2021

(87) PCT Pub. No.: WO2020/116409
PCT Pub. Date: Jun. 11, 2020

(65) Prior Publication Data
US 2022/0061150 A1    Feb. 24, 2022

(30) Foreign Application Priority Data
Dec. 3, 2018    (JP) .............................. JP2018-226550

(51) Int. Cl.
*H05K 9/00*    (2006.01)
*H05K 1/02*    (2006.01)
*H05K 1/09*    (2006.01)

(52) U.S. Cl.
CPC ......... *H05K 1/0218* (2013.01); *H05K 1/0215* (2013.01); *H05K 1/09* (2013.01); *H05K 9/0064* (2013.01); *H05K 2201/0715* (2013.01)

(58) Field of Classification Search
CPC .................................................... H05K 9/0064
See application file for complete search history.

(56) References Cited

U.S. PATENT DOCUMENTS

2012/0048603 A1    3/2012 Huang
2012/0124829 A1*   5/2012 Kamei ................... H05K 3/421
                                                                29/846
(Continued)

FOREIGN PATENT DOCUMENTS

JP    2015053412 A    3/2015
JP    2016122687 A    7/2016
(Continued)

OTHER PUBLICATIONS

International Search Report dated Feb. 25, 2020, issued in International Application No. PCT/JP2019/047104.
(Continued)

*Primary Examiner* — Hung V Ngo
(74) *Attorney, Agent, or Firm* — United IP Counselors, LLC; Kenneth Fagin

(57) ABSTRACT

Provided is a ground member that can prevent damage to interlayer adhesion between a conductive layer and an adhesive layer of the ground member due to heating in producing a shielded printed wiring board or in mounting an electronic component on a shielded printed wiring board. The ground member of the present invention includes: a conductive layer; and an adhesive layer stacked on the conductive layer, the adhesive layer containing a binder component and hard particles, the adhesive layer having a thickness of 5 to 30 μm.

17 Claims, 6 Drawing Sheets

(56) References Cited

U.S. PATENT DOCUMENTS

2015/0044386 A1* 2/2015 Vilkomerson ........ H01L 41/193
427/58
2016/0007444 A1 1/2016 Watanabe et al.

FOREIGN PATENT DOCUMENTS

| JP | 2018039959 A | 3/2018 |
| WO | 2014132951 A1 | 9/2014 |
| WO | 2018147298 A1 | 8/2018 |

OTHER PUBLICATIONS

Written Opinion dated Feb. 25, 2020, issued in International Application No. PCT/JP2019/047104.

* cited by examiner

FIG.1
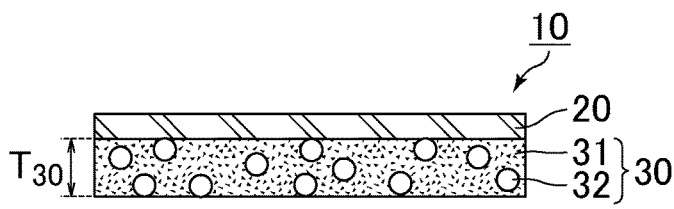
FIG.2A
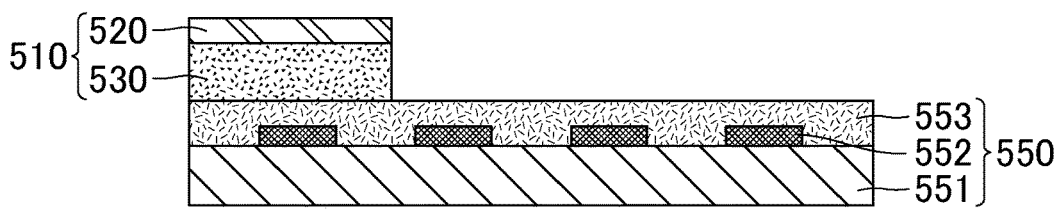
FIG.2B
FIG.2C
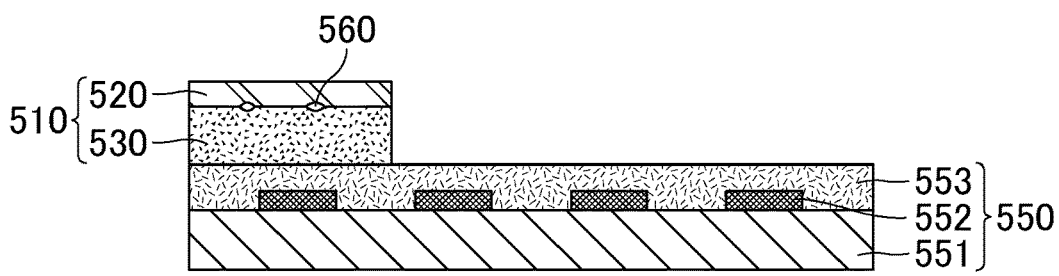
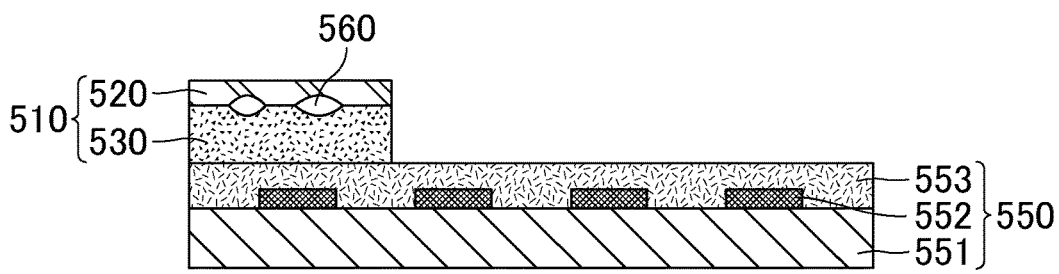
FIG.3A
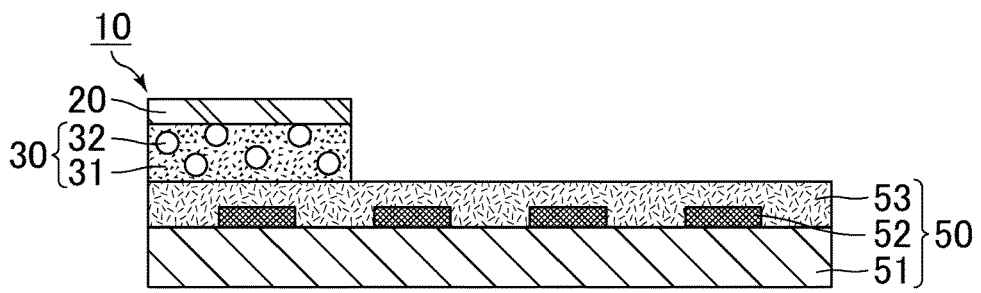

GROUND MEMBER AND SHIELDED PRINTED WIRING BOARD

TECHNICAL FIELD

The present invention relates to ground members and shielded printed wiring boards.

BACKGROUND ART

Printed wiring boards are widely used to incorporate circuits into mechanisms of electronic devices such as mobile phones, video cameras, and notebook computers. Printed wiring boards are also used to connect a movable part such as a printer head to a control unit. These electronic devices require electromagnetic wave shielding. Thus, printed wiring boards used in these devices employ shielded printed wiring boards provided with electromagnetic wave shielding.

A method for shielding electromagnetic waves has been known in which a printed wiring board is covered with a conductive shielding layer.

Also, a method for reducing noises has been known in which a ground circuit of a printed wiring board is electrically connected to an external ground with a shielding layer in between.

Patent Literature 1 discloses a shielded printed wiring board further including an external ground member in order to surely electrically connect a ground circuit of printed circuits to an external ground.

In other words, Patent Literature 1 discloses a shielded printed wiring board including a printed wiring board and an electromagnetic wave shielding layer covering at least part of conductive line(s) of the printed wiring board, the shielded printed wiring board further including an external ground member that is electrically connect to a ground circuit of the printed wiring board and an external ground, the electromagnetic wave shielding layer being electrically connected to the ground circuit of the printed wiring board and the external ground member, a first part of the external ground member being located between the printed wiring board and the electromagnetic wave shielding layer, a second part of the external ground member having a first surface on the printed wiring board and an second surface exposed.

CITATION LIST

Patent Literature
Patent Literature 1: JP 2016-122687 A

SUMMARY OF INVENTION

Technical Problem

The external ground member (ground member) disclosed in Patent Literature 1 includes metal foil (conductive layer) and an adhesive layer disposed on a surface of the metal foil.

In the printed wiring board disclosed in Patent Literature 1, the printed pattern on the base film is covered with an insulating film (coverlay).

In production of a shielded printed wiring board using such a ground member, the ground member is firstly disposed on a printed wiring board such that an adhesive layer of the ground member is in contact with the printed wiring board. Next, the ground member is attached and fixed to the printed wiring board by pressing and heating.

On a shielded printed wiring board including such a ground member, an electronic component is further to be mounted. Mounting an electronic component is performed by soldering. For mounting an electronic component by solder reflowing, the shielded printed wiring board is heated.

Such heating of a shielded printed wiring board in producing a shielded printed wiring board or in mounting an electronic component on a shielded printed wiring board causes gas from member(s) such as an adhesive layer of the ground member and a coverlay of the printed wiring board. Also, when the base film of the printed wiring board is formed from a highly hygroscopic resin such as polyimide, the heating may cause water vapor from the base film. These volatile components generated from the adhesive layer of the ground member, the coverlay, and/or the base film cannot pass through the conductive layer of the ground member and thus remain between the conductive layer and the adhesive layer.

Thus, when rapid heating is further performed, the volatile components remaining between the conductive layer and the adhesive layer of the ground member expand to damage interlayer adhesion between the conductive layer and the adhesive layer of the ground member.

The present invention has been made in view of the above issues, and aims to provide a ground member that can prevent damage to interlayer adhesion between a conductive layer and an adhesive layer of the ground member due to heating in producing a shielded printed wiring board or in mounting an electronic component on a shielded printed wiring board.

Solution to Problem

A ground member of the present invention includes: a conductive layer; and an adhesive layer stacked on the conductive layer, the adhesive layer containing a binder component and hard particles, the adhesive layer having a thickness of 5 to 30 μm.

The ground member of the present invention is to be used for production of a shielded printed wiring board.

Specifically, in production of a shielded printed wiring board, the ground member of the present invention is disposed on a printed wiring board in a manner that the adhesive layer is in contact with a coverlay of the printed wiring board.

The ground member is then attached and fixed to the printed wiring board by pressing and heating.

Through the pressing and heating, hard particles contained in the adhesive layer of the ground member of the present invention push the conductive layer of the ground member to form in the conductive layer pores and hollows which volatile components can pass through.

Thus, volatile components, when generated due to heating in producing the shielded printed wiring board, can pass through the conductive layer.

Also, in mounting an electronic component on a shielded printed wiring board including the ground member of the present invention, volatile components, when generated due to heating the shielded printed wiring board during solder reflowing, can pass through the conductive layer.

In other words, volatile components can be prevented from remaining between the conductive layer and the adhesive layer of the ground member.

This can resultantly prevent damage to interlayer adhesion between the conductive layer and the adhesive layer of the ground member due to heating in producing a shielded printed wiring board or in mounting an electronic component on a shielded printed wiring board.

In the ground member of the present invention, the adhesive layer has a thickness of 5 to 30 µm.

An adhesive layer having a thickness smaller than 5 µm causes insufficient adhesiveness.

An adhesive layer having a thickness greater than 30 µm distributes the pressure of hard particles pushing the conductive layer during pressing and heating, failing in forming in the conductive layer pores and hollows which volatile components can pass through.

In the ground member of the present invention, the hard particles preferably have a Mohs hardness value 1.5 times or more higher than the conductive layer.

Hard particles having a Mohs hardness value 1.5 times or more higher than the conductive layer tend to be embedded in the conductive layer during pressing and heating.

As a result, pores and hollows which volatile components can pass through tend to be formed in the conductive layer.

In the ground member of the present invention, the hard particles preferably have a Mohs hardness value of 4 to 7.

In pressing and heating, hard particles having a Mohs hardness value of 4 to 7 tend to avoid being crushed and thus tend to form in the conductive layer pores and hollows which volatile components can pass through.

In the ground member of the present invention, the hard particles preferably have an average particle size of 2.5 to 25 µm.

In pressing and heating, hard particles having an average particle size within this range can suitably form in the conductive layer pores and hollows which volatile components can pass through.

In pressing and heating, hard particles having an average particle size smaller than 2.5 µm are less likely to form in the conductive layer sufficiently large pores and hollows, and the volatile components are less likely to pass through the pores and hollows.

In pressing and heating, hard particles having an average particle size greater than 25 µm tend to form too large pores and hollows in the conductive layer, and the strength of the conductive layer thereby tends to be reduced.

In the ground member of the present invention, the hard particles preferably contain silica.

Silica, having a sufficiently high Mohs hardness value, suitably functions as hard particles.

In the ground member of the present invention, the conductive layer preferably contains at least one selected from the group consisting of copper, silver, gold, and nickel.

In a shielded printed wiring board including the ground member of the present invention, a conductive layer of the ground member is electrically connected to a grounded circuit of the printed wiring board. Also, in a shielded printed wiring board including the ground member of the present invention, the conductive layer is connected to an external ground.

In the ground member, a conductive layer containing at least one selected from the group consisting of copper, silver, gold, and nickel, which are materials having excellent conductivity, can reduce the electrical resistance value between the ground circuit and the external ground.

In the ground member of the present invention, the adhesive layer preferably further contains conductive particles.

In this case, the adhesive layer functions as a conductive adhesive layer.

In the ground member of the present invention, the hard particles preferably have a smaller average particle size than the conductive particles.

Hard particles having a greater average particle size than the conductive particles tend to be exposed through the adhesive layer of the ground member. Thereby, the adhesive layer tends to lose adhesiveness.

In the ground member of the present invention, the hard particles preferably have a higher Mohs hardness value than the conductive particles.

Hard particles having a higher Mohs hardness value than the conductive particles tend to form in the conductive layer pores and hollows which volatile components can pass through even when an adherend of the ground member of the present invention is soft.

In the ground member of the present invention, the binder component in the adhesive layer preferably has a thickness smaller than the average particle size of the conductive particles.

The ground member of the present invention may be disposed on an electromagnetic wave shielding film including a protective layer and a shielding layer stacked on the protective layer.

In this case, the ground member is disposed in a manner that the adhesive layer of the ground member is in contact with the protective layer of the electromagnetic wave shielding film and the conductive particles of the ground member penetrate the protective layer of the electromagnetic wave shielding film.

In such a case, when the thickness of the binder component in the adhesive layer is smaller than the average particle size of the conductive particles, the conductive particles can surely penetrate the protective layer of the electromagnetic wave shielding film to be in contact with the shielding layer of the electromagnetic wave shielding film.

The ground member of the present invention may be disposed on an electromagnetic wave shielding film including a protective layer and a shielding layer stacked on the protective layer in a manner that the adhesive layer is in contact with the protective layer and the conductive particles penetrate the protective layer.

The conductive layer of the ground member of the present invention is to be connected to an external ground, and the shielding layer of the electromagnetic wave shielding film is to be electrically connected to the ground circuit of a printed wiring board.

The conductive particles of the ground member of the present invention penetrate the protective layer of the electromagnetic wave shielding film to be in contact with the shielding layer of the electromagnetic wave shielding film.

Thus, use of the ground member of the present invention can electrically connect a ground circuit of a printed wiring board including an electromagnetic wave shielding film to an external ground.

The ground member of the present invention may be disposed on a shielded printed wiring board that includes: a printed wiring board including a base film, a printed circuit including a ground circuit and being disposed on the base film, and a coverlay covering the printed circuit; a shielding layer being disposed on the coverlay and being electrically connected to the ground circuit; and a protective layer being disposed on a surface opposite a printed circuit side surface of the shielding layer, and the ground member may be disposed in a manner that the adhesive layer is in contact with the protective layer and the conductive particles penetrate the protective layer.

The conductive layer of the ground member of the present invention is to be electrically connected to an external ground.

The conductive particles of the ground member penetrate the protective layer of the shielded printed wiring board to be in contact with the shielding layer.

Thus, use of the ground member of the present invention can electrically connect a ground circuit of a shielded printed wiring board to an external ground.

In the ground member of the present invention, the adhesive layer may have insulation properties, and the conductive layer may have one or more conductive bumps on a side facing the adhesive layer.

A ground member having one or more conductive bumps can electrically connect a conductive layer and an adherend via the one or more conductive bumps.

A shielded printed wiring board according to an embodiment of the present invention includes: a printed wiring board including a base film, a printed circuit including a ground circuit and being disposed on the base film, and a coverlay covering the printed circuit; and a shielding layer being disposed on the coverlay and being electrically connected to the ground circuit, the shielded printed wiring board further including the ground member of the present invention, the ground member being disposed in a manner that the adhesive layer of the ground member is in contact with the coverlay, the conductive layer of the ground member and the shielding layer being electrically connected to each other.

A shielded printed wiring board according to another embodiment of the present invention includes: a printed wiring board including a base film, a printed circuit including a ground circuit and being disposed on the base film, and a coverlay covering the printed circuit; and an electromagnetic wave shielding film being disposed on the coverlay and including a conductive adhesive layer and a shielding layer stacked on the conductive adhesive layer, the conductive adhesive layer being electrically connected to the ground circuit, the shielded printed wiring board further including the ground member of the present invention, the ground member being disposed in a manner that the adhesive layer of the ground member is in contact with the coverlay, the conductive layer of the ground member and the conductive adhesive layer of the electromagnetic wave shielding film being electrically connected to each other.

A shielded printed wiring board according to still another embodiment of the present invention includes: a printed wiring board including a base film, a printed circuit including a ground circuit and being disposed on the base film, and a coverlay covering the printed circuit; a shielding layer being disposed on the coverlay and being electrically connected to the ground circuit; and a protective layer disposed on a surface opposite a printed circuit side surface of the shielding layer, the shielded printed wiring board further including the ground member of the invention, the ground member being disposed in a manner that the adhesive layer of the ground member is in contact with the protective layer, the conductive particles of the ground member penetrating the protective layer and being electrically connected to the conductive layer of the ground member and the shielding layer.

A shielded printed wiring board according to still another embodiment of the present invention includes: a printed wiring board including a base film, a printed circuit including a ground circuit and being disposed on the base film, and a coverlay covering the printed circuit; a shielding layer being disposed on the coverlay and being electrically connected to the ground circuit; and a protective layer disposed on a surface opposite a printed circuit side surface of the shielding layer, the shielded printed wiring board further including the ground member of the present invention, the ground member being disposed in a manner that the adhesive layer of the ground member is in contact with the protective layer, the one or more conductive bumps of the ground member penetrating the protective layer and being electrically connected to the conductive layer of the ground member and the shielding layer.

These shielded printed wiring boards of the present invention include the ground member of the present invention.

This structure can prevent damage to interlayer adhesion between the conductive layer and the adhesive layer of the ground member due to heating in producing a shielded printed wiring board or in mounting an electronic component on a shielded printed wiring board.

Advantageous Effects of Invention

The ground member of the present invention is used for production of a shielded printed wiring board.

Through pressing and heating in producing a shielded printed wiring board, hard particles contained in the adhesive layer of the ground member of the present invention push the conductive layer of the ground member to form in the conductive layer pores and hollows which volatile components can pass through.

Thus, volatile components, when generated due to heating in producing a shielded printed wiring board, can pass through the conductive layer. In other words, volatile components can be prevented from remaining between the conductive layer and the adhesive layer of the ground member.

This can resultantly prevent damage to interlayer adhesion between the conductive layer and the adhesive layer of the ground member due to heating in producing a shielded printed wiring board or in mounting an electronic component on a shielded printed wiring board.

BRIEF DESCRIPTION OF DRAWINGS

FIG. 1 is a schematic cross-sectional view showing an exemplary ground member according to a first embodiment of the present invention.

FIG. 2A is a schematic view showing an example for producing a printed wiring board using a conventional ground member.

FIG. 2B is a schematic view showing an example for producing a printed wiring board using the conventional ground member.

FIG. 2C is a schematic view showing an example for producing a printed wiring board using the conventional ground member.

FIG. 3A is a schematic view showing an example for producing a printed wiring board using a ground member according to a first embodiment of the present invention.

DESCRIPTION OF EMBODIMENTS

Figure 3B:
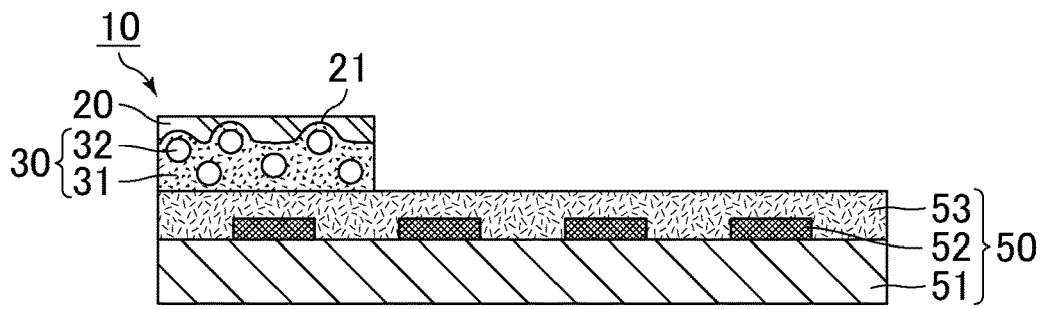
FIG. 3B is a schematic view showing an example for producing a printed wiring board using the ground member according to the first embodiment of the present invention.

The following specifically describes the ground member of the present invention. The present invention is not limited to the following embodiments, and can be appropriately modified without changing the gist of the invention.

First Embodiment

A ground member according to a first embodiment of the present invention is described with reference to the figures.

FIG. 1 is a schematic cross-sectional view showing an exemplary ground member according to a first embodiment of the present invention.

As shown in FIG. 1, a ground member 10 includes a conductive layer 20 and an adhesive layer 30 stacked on the conductive layer 20.

The adhesive layer 30 includes a binder component 31 and hard particles 32.

The adhesive layer 30 has a thickness T30 of 5 to 30 μm.

The ground member 10 is to be used for production of a shielded printed wiring board.

Firstly, problems in producing a shielded printed wiring board using a conventional ground member are described with reference to the figures.

FIG. 2A, FIG. 2B, and FIG. 2C are schematic views showing an example for producing a printed wiring board using a conventional ground member.

As shown in FIG. 2A, a conventional ground member 510 including a conductive layer 520 and an adhesive layer 530 stacked on the conductive layer 520 is to be disposed on a printed wiring board 550 including a base film 551, printed circuits 552 disposed on the base film 551, and a coverlay 553 covering the printed circuits 552.

Here, the adhesive layer 530 of the conventional ground member 510 is located on the printed wiring board 550 side.

Then, pressing and heating is performed so that the conventional ground member 510 is attached and fixed to the printed wiring board 550.

On the printed wiring board 550 including such a ground member 510 is to be further mounted an electronic component. The electronic component is mounted by soldering. For mounting the electronic component by solder reflowing, the printed wiring board 550 is heated.

Such heating of the printed wiring board 550 causes gas from the adhesive layer 530 of the conventional ground member 510 and/or the coverlay 553 of the printed wiring board 550. Also, when the base film 551 of the printed wiring board 550 is formed from a highly hygroscopic resin such as polyimide, the heating may cause moisture or the like to be volatilized from the base film 551. These volatile components 560 generated from the adhesive layer 530 of the conventional ground member 510, the coverlay 553, and/or the base film 551 cannot pass through the conductive layer 520 of the conventional ground member 510 as shown in FIG. 2B and thus remain between the conductive layer 520 and the adhesive layer 530.

Thus, when rapid heating is further performed, the volatile components remaining between the conductive layer 520 and the adhesive layer 530 of the conventional ground member 510 expand as shown in FIG. 2C to possibly damage interlayer adhesion between the conductive layer 520 and the adhesive layer 530 of the conventional ground member 510.

Next, the case of producing a shielded printed wiring board using the ground member according to the first embodiment of the present invention is described with reference to the figures.

Figure 3C:
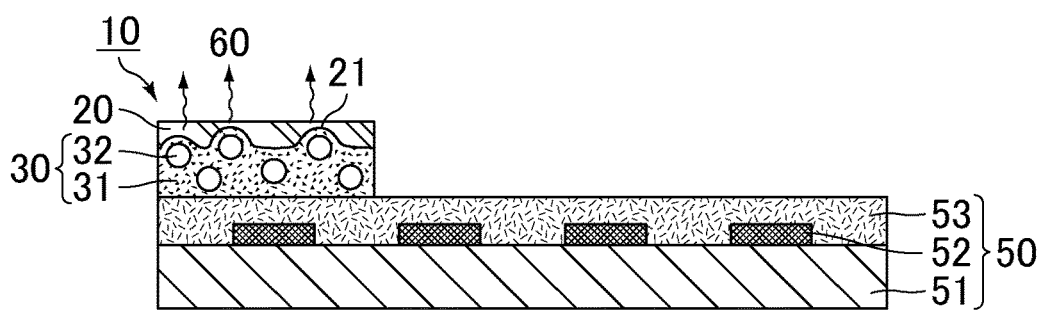
FIG. 3C is a schematic view showing an example for producing a printed wiring board using the ground member according to the first embodiment of the present invention.

FIG. 3A, FIG. 3B, and FIG. 3C are schematic views showing an example for producing a printed wiring board using the ground member according to the first embodiment of the present invention.

As shown in FIG. 3A, the ground member 10 including the conductive layer 20 and the adhesive layer 30 stacked on the conductive layer 20 is to be disposed on a printed wiring board 50 including a base film 51, printed circuits 52 disposed on the base film 51, and a coverlay 53 covering the printed circuits 52.

Here, the adhesive layer 30 of the ground member 10 is located on the printed wiring board 50 side.

Then, pressing and heating is performed so that the ground member 10 is attached and fixed to the printed wiring board 50.

Here, the hard particles 32 contained in the adhesive layer 30 of the ground member 10 push the conductive layer 20 of the ground member 10 to form in the conductive layer 20 pores and hollows 21 which volatile components can pass through as shown in FIG. 3B.

As described above, volatile components are generated when the ground member 10 is disposed on the printed wiring board 50 and the ground member 10 and the printed wiring board 50 are subjected to pressing and heating or when an electronic component is mounted on the printed wiring board 50.

As shown in FIG. 3C, such volatile components 60 can pass through the conductive layer 20 via the pores and hollows 21.

In other words, the volatile components 60 can be prevented from remaining between the conductive layer 20 and the adhesive layer 30 of the ground member 10.

This can resultantly prevent damage to interlayer adhesion between the conductive layer 20 and the adhesive layer 30 of the ground member 10.

Next, the structures of the members of the ground member 10 are described.

(Conductive Layer)

Any conductive material is available for the conductive layer 20 of the ground member 10, and the conductive layer 20 preferably contains at least one selected from the group consisting of copper, silver, gold, and nickel.

In a shielded printed wiring board including the ground member 10, the conductive layer 20 of the ground member 10 may be electrically connected to a grounded circuit of the printed wiring board. In a shielded printed wiring board including the ground member 10, the conductive layer 20 may be connected to an external ground.

In the ground member 10, a conductive layer containing at least one selected from the group consisting of copper, silver, gold, and nickel, which are materials with excellent conductivity, can reduce the electrical resistance value between the ground circuit and the external ground.

In the ground member 10, the conductive layer 20 has a thickness of preferably 1 to 9 μm, more preferably 2 to 7 μm.

A conductive layer having a thickness smaller than 1 μm has reduced strength and thus tends to be broken.

A conductive layer having a thickness greater than 9 μm is too thick and is thus less likely to allow hard particles to form pores and hollows which volatile components can pass through.

(Adhesive Layer)

In the ground member 10, the adhesive layer 30 has the thickness T30 of 5 to 30 μm.

The adhesive layer 30 preferably has the thickness T30 of 10 to 20 μm.

An adhesive layer having a thickness smaller than 5 μm causes insufficient adhesiveness.

An adhesive layer having a thickness greater than 30 μm distributes the pressure of hard particles pushing the conductive layer during pressing and heating, failing in forming in the conductive layer pores and hollows which volatile components can pass through.

As described above, the hard particles 32 contained in the adhesive layer 30 have a Mohs hardness value of preferably 1.5 times or more, more preferably 1.6 to 2.3 times, higher than the conductive layer 20.

Hard particles 32 having a Mohs hardness value 1.5 times or more higher than the conductive layer 20 tend to be embedded in the conductive layer 20 during pressing and heating.

As a result, the pores and hollows 21 which volatile components can pass through tend to be formed in the conductive layer 20.

The hard particles 32 preferably have a Mohs hardness value of 4 to 7, more preferably 5 to 7.

In pressing and heating, hard particles 32 having a Mohs hardness value of 4 to 7 tend to avoid being crushed and thus tend to form in the conductive layer 20 the pores and hollows 21 which volatile components can pass through.

The hard particles 32 preferably have an average particle size of 2.5 to 25 μm, more preferably 2.5 to 10 μm.

In pressing and heating, hard particles 32 having an average particle size within this range can suitably form in the conductive layer 20 the pores and hollows 21 which volatile components can pass through.

In pressing and heating, hard particles having an average particle size smaller than 2.5 μm are less likely to form in the conductive layer sufficiently large pores and hollows, and the volatile components are less likely to pass through the pores and hollows.

In pressing and heating, hard particles having an average particle size greater than 25 μm tend to form in the conductive layer too large pores and hollows, and the strength of the conductive layer thereby tends to be reduced.

The hard particles 32 preferably contain silica.

Silica, having a Mohs hardness value of 7, is sufficiently hard and thus suitably functions as hard particles.

Non-limiting examples of the material for the binder component 31 constituting the adhesive layer 30 include thermoplastic resins such as polystyrene-based thermoplastic resin, vinyl acetate-based thermoplastic resin, polyester-based thermoplastic resin, polyethylene-based thermoplastic resin, polypropylene-based thermoplastic resin, polyamide-based thermoplastic resin, rubber-based thermoplastic resin, and acrylic thermoplastic resin, and heat-curable resins such as phenol-based heat-curable resin, epoxy-based heat-curable resin, urethane-based heat-curable resin, urethane urea-based heat-curable resin, melamine-based heat-curable resin, and alkyd-based heat-curable resin.

Next, a method of producing a shielded printed wiring board using the ground member 10 is described.

A method of producing a shielded printed wiring board using the ground member 10 includes step (1) of preparing a printed wiring board, step (2) of disposing a ground member, step (3) of disposing an electromagnetic wave shielding film, and step (4) of pressing and heating.

These steps are each described with reference to the figures hereinbelow.

Figure 4:
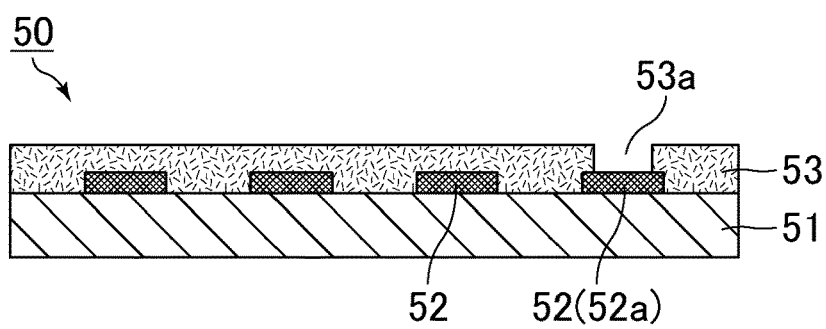
FIG. 4 is a schematic view showing an exemplary printed wiring board preparing step of a method of producing a shielded printed wiring board using the ground member according to the first embodiment of the present invention.

FIG. 4 is a schematic view showing an exemplary printed wiring board preparing step of a method of producing a shielded printed wiring board using the ground member according to the first embodiment of the present invention.

Figure 5:
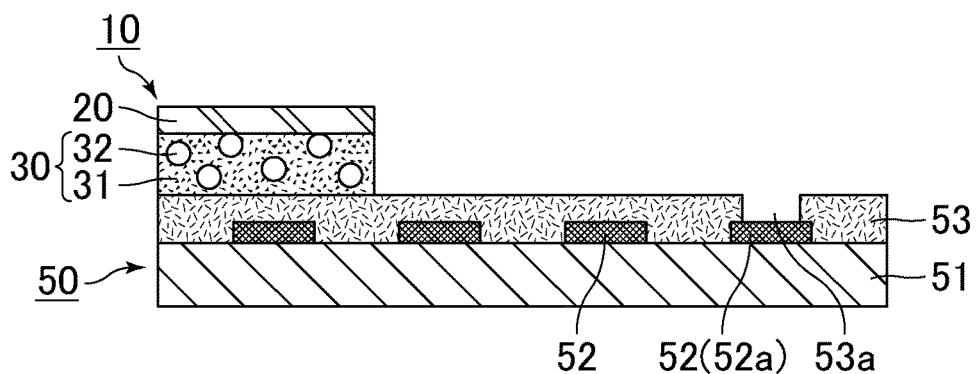
FIG. 5 is a schematic view showing an exemplary ground member disposing step of the method of producing a shielded printed wiring board using the ground member according to the first embodiment of the present invention.

FIG. 5 is a schematic view showing an exemplary ground member disposing step of the method of producing a shielded printed wiring board using the ground member according to the first embodiment of the present invention.

Figure 6:
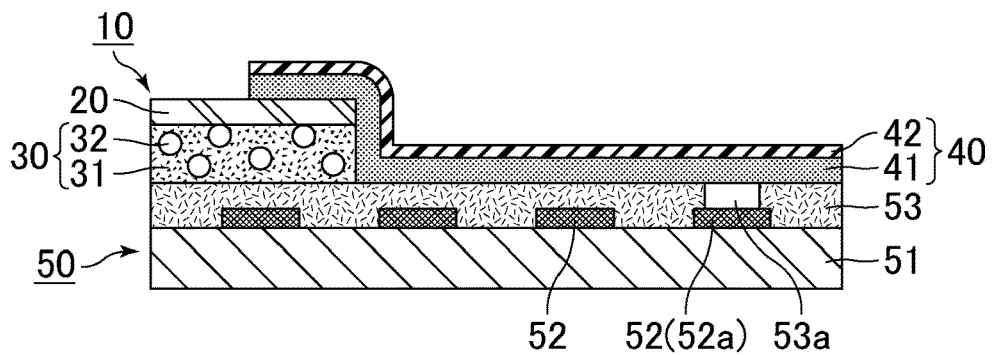
FIG. 6 is a schematic view showing an exemplary electromagnetic wave shielding film disposing step of the method of producing a shielded printed wiring board using the ground member according to the first embodiment of the present invention.

FIG. 6 is a schematic view showing an exemplary electromagnetic wave shielding film disposing step of the method of producing a shielded printed wiring board using the ground member according to the first embodiment of the present invention.

Figure 7A:
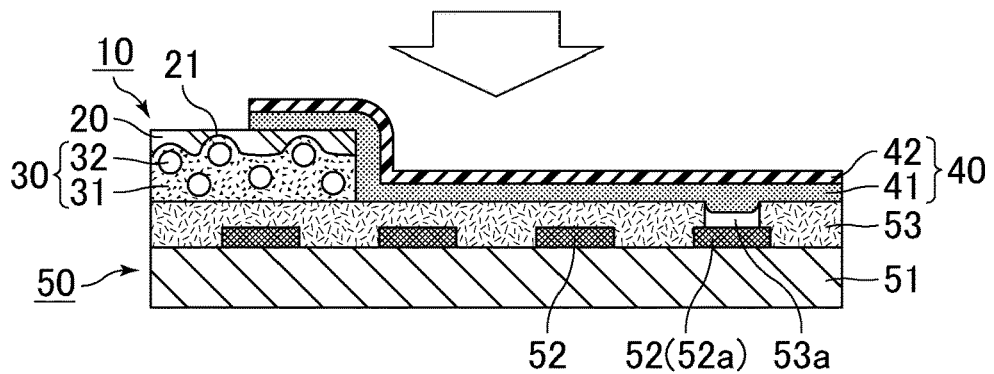
FIG. 7A is a schematic view showing an exemplary pressing and heating step of the method of producing a shielded printed wiring board using the ground member according to the first embodiment of the present invention.
Figure 7B:
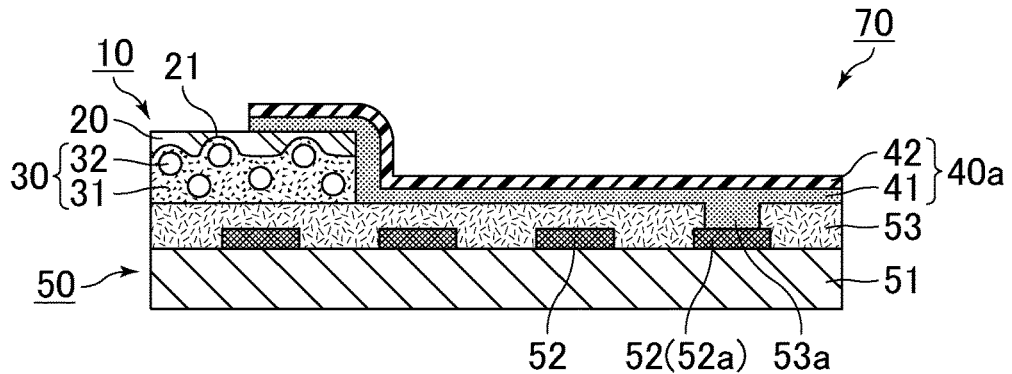
FIG. 7B is a schematic view showing an exemplary pressing and heating step of the method of producing a shielded printed wiring board using the ground member according to the first embodiment of the present invention.

FIG. 7A and FIG. 7B are schematic views showing an exemplary pressing and heating step of the method of producing a shielded printed wiring board using the ground member according to the first embodiment of the present invention.

(1) Printed Wiring Board Preparing Step

In this step, as shown in FIG. 4, the printed wiring board 50 including the base film 51, the printed circuits 52 including a ground circuit 52a and being disposed on the base film 51, and the coverlay 53 covering the printed circuits 52 is prepared.

In the printed wiring board 50, part of the ground circuit 52a is exposed through an opening 53a of the coverlay 53.

The base film 51 and the coverlay 53 are each preferably made of engineering plastic. Examples of the engineering plastic include resins such as polyethylene terephthalate, polypropylene, cross-linked polyethylene, polyester, polybenzimidazole, polyimide, polyimide amide, polyether imide, and polyphenylene sulfide.

Among these engineering plastics, a polyphenylene sulfide film is preferred for demand for flame retardancy, and a polyimide film is preferred for demand for heat resistance.

The base film 51 preferably has a thickness of 10 to 40 µm.

The coverlay 53 preferably has a thickness of 10 to 50 µm.

Any printed circuit material is available for the printed circuits 52, and examples thereof include copper foil and a cured product of a conductive paste.

(2) Ground Member Disposing Step

Next, as shown in FIG. 5, the ground member 10 is disposed on the printed wiring board 50 in a manner that the adhesive layer 30 of the ground member 10 is in contact with the coverlay 53 of the printed wiring board 50.

(3) Electromagnetic Wave Shielding Film Disposing Step

Next, as shown in FIG. 6, an electromagnetic wave shielding film 40 including a conductive adhesive layer 41 and a metal thin film 42 stacked on the conductive adhesive layer 41 is prepared.

Then, the electromagnetic wave shielding film 40 is disposed on the printed wiring board 50 in a manner that the conductive adhesive layer 41 of the electromagnetic wave shielding film 40 is in contact with the coverlay 53 of the printed wiring board 50 and part of the ground member 10.

Here, the electromagnetic wave shielding film 40 is disposed in a manner that, after the later-described pressing and heating step, the conductive adhesive layer 41 of the electromagnetic wave shielding film 40 fills the opening 53a in the printed wiring board 50 to be in contact with the ground circuit 52a.

Also, the electromagnetic wave shielding film 40 is disposed in a manner that, after the later-described pressing and heating step, the conductive adhesive layer 41 of the electromagnetic wave shielding film 40 is in contact with the conductive layer 20 of the ground member 10.

The conductive adhesive layer 41 of the electromagnetic wave shielding film 40 is preferably formed from conductive particles and resin.

The conductive particles may be formed from any conductive material, preferably at least one selected from the group consisting of copper powder, silver powder, nickel powder, silver-coated copper powder, gold-coated copper powder, silver-coated nickel powder, and gold-coated nickel powder.

Examples of usable resin include a styrene-based resin composition, a vinyl acetate-based resin composition, a polyester-based resin composition, a polyethylene-based resin composition, a polypropylene-based resin composition, an imide-based resin composition, an amide-based resin composition, an acrylic resin composition, a phenol-based resin composition, an epoxy-based resin composition, a urethane-based resin composition, a melamine-based resin composition, and an alkyd-based resin composition.

The metal thin film 42 of the electromagnetic wave shielding film 40 may include a layer formed from a material such as gold, silver, copper, aluminum, nickel, tin, palladium, chromium, titanium, or zinc and preferably includes a copper layer.

Copper is a suitable material for the metal thin film 42 in terms of conductivity and economic efficiency.

The metal thin film 42 may include a layer of an alloy containing the above metal(s).

Also, the metal thin film 42 may be metal foil or a metal film formed by a technique such as sputtering, electroless plating, or electrolytic plating.

(4) Pressing and Heating Step

Next, as shown in FIG. 7A, the printed wiring board 50, the ground member 10, and the electromagnetic wave shielding film 40 are pressed and heated, whereby the ground member 10 and the electromagnetic wave shielding film 40 are pressure bonded with the printed wiring board 50.

Here, the conductive adhesive layer 41 of the electromagnetic wave shielding film 40 fills the opening 53a and is thereby in contact with the ground circuit 52a.

Also, the conductive adhesive layer 41 of the electromagnetic wave shielding film 40 is in contact with the conductive layer 20 of the ground member 10.

As shown in FIG. 7B, the electromagnetic wave shielding film 40 after pressing and heating serves as a shielding layer 40a.

Also, as shown in FIG. 7B, in this step, the hard particles 32 contained in the adhesive layer 30 of the ground member 10 push the conductive layer 20 of the ground member 10 to form in the conductive layer 20 the pores and hollows 21 which volatile components can pass through.

In the pressing and heating step, volatile components are generated from the coverlay 53 of the printed wiring board 50 and/or the adhesive layer 30 of the ground member 10.

Such volatile components can pass through the conductive layer 20 via the pores and hollows 21.

In other words, the volatile components 60 can be prevented from remaining between the conductive layer 20 and the adhesive layer 30 of the ground member 10.

This can resultantly prevent damage to interlayer adhesion between the conductive layer 20 and the adhesive layer 30 of the ground member 10.

The heating temperature in the pressing and heating step is preferably 100° C. to 190° C., more preferably 120° C. to 170° C.

The pressing pressure in the pressing and heating step is preferably 0.5 to 4.0 Pa, more preferably 2.0 to 3.0 Pa.

Through these steps, a shielded printed wiring board 70 can be produced.

Such a shielded printed wiring board 70 is also a shielded printed wiring board of the present invention.

In other words, as shown in FIG. 7B, the shielded printed wiring board 70 includes the printed wiring board 50, the shielding layer 40a, and the ground member 10.

The printed wiring board 50 includes the base film 51, the printed circuits 52 including the ground circuit 52a and being disposed on the base film 51, and the coverlay 53 covering the printed circuits 52. The coverlay 53 has the opening 53a through which the ground circuit 52a is exposed.

The shielding layer 40a includes the conductive adhesive layer 41 and the metal thin film 42 stacked on the conductive adhesive layer 41.

The shielding layer 40a is disposed on the printed wiring board 50 in a manner that the conductive adhesive layer 41 is in contact with the coverlay 53.

Then, the conductive adhesive layer 41 fills the opening 53a of the coverlay 53 and is thereby in contact with the ground circuit 52a.

The ground member 10 includes the conductive layer 20 and the adhesive layer 30 stacked on the conductive layer 20.

Also, the ground member 10 is disposed on the printed wiring board 50 in a manner that the adhesive layer 30 is in contact with the coverlay 53.

Thus, the conductive layer 20 of the ground member 10 and the shielding layer 40a are electrically connected to each other.

Also, the conductive adhesive layer 41 of the shielding layer 40a is in contact with the ground circuit 52a. Thus, the conductive layer 20 of the ground member 10 and the ground circuit 52a are also electrically connected to each other.

Accordingly, electrically connecting the conductive layer 20 of the ground member 10 to an external ground (not shown) can electrically connect the ground circuit 52a of the shielded printed wiring board 70 to the external ground.

In the shielded printed wiring board of the present invention, the shielding layer may include an insulating adhesive layer and a metal thin film stacked on the insulting adhesive layer.

In this case, conductive bumps may be formed on the insulting adhesive layer side of the metal thin film, or the metal thin film may have protrusions. Then, for example, the conductive bumps or the protrusions of the metal thin film are allowed to be in contact with the ground circuit of the printed wiring board, the shielding layer is allowed to be in contact with the conductive layer of the ground member, and the conductive layer of the ground member is allowed to be in contact with an external ground, whereby the ground circuit of the shielded printed wiring board and the external ground can be electrically connected to each other.

Second Embodiment

Hereinbelow, a ground member according to a second embodiment of the present invention is described with reference to the figures.

Figure 8:
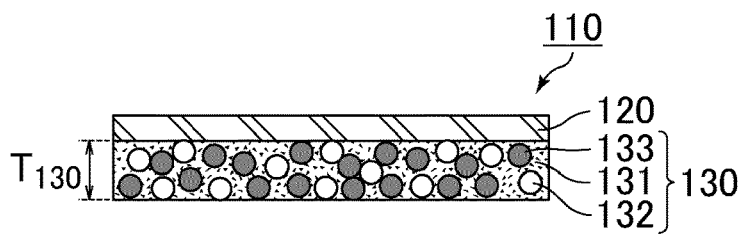
FIG. 8 is a schematic cross-sectional view showing an exemplary ground member according to a second embodiment of the present invention.

FIG. 8 is a schematic cross-sectional view showing an exemplary ground member according to a second embodiment of the present invention.

A ground member 110 shown in FIG. 8 has the same structure as the ground member 10 except that an adhesive layer 130 contains conductive particles 133.

In other words, as shown in FIG. 8, the ground member 110 includes a conductive layer 120 and the adhesive layer 130 stacked on the conductive layer 120.

The adhesive layer 130 contains a binder component 131, hard particles 132, and the conductive particles 133.

The adhesive layer 130 has a thickness T130 of 5 to 30 µm.

In the ground member 110, the adhesive layer 130, containing the conductive particles 133, functions as a conductive adhesive layer.

In the ground member 110, the hard particles 132 preferably have a smaller average particle size than the conductive particles 133.

Hard particles 132 having a greater average particle size than the conductive particles 133 tend to be exposed through the adhesive layer 130 of the ground member 110. Thereby, the adhesive layer 130 tends to lose adhesiveness.

Also, in the ground member 110, the conductive particles 133 have an average particle size of preferably 8 to 25 µm, more preferably 10 to 25 µm.

In the ground member 110, the hard particles 132 preferably have a higher Mohs hardness value than the conductive particles 133, and more preferably have a Mohs hardness value 1.2 times or more higher than the conductive particles 133.

Hard particles 132 having a higher Mohs hardness value than the conductive particles 133 tend to form in the conductive layer 120 pores and hollows which volatile components can pass through even when an adherend of the ground member 110 is soft.

Also, in the ground member 110, the conductive particles 133 have a Mohs hardness value of preferably 5 to 9, more preferably 6 to 7.

Non-limiting examples of the material for the conductive particles 133 include carbon, silver, copper, nickel, solder, aluminum, a silver-coated copper filler containing silver-plated copper powder, a filler containing metal-plated resin balls or metal-plated glass beads, and a mixture of these fillers. Preferred among these are a silver-coated copper filler and nickel because they are relatively inexpensive and have excellent conductivity.

The ground member 110 may be disposed on an electromagnetic wave shielding film including a protective layer and a shielding layer stacked on the protective layer.

Such a case of disposing the ground member 110 on an electromagnetic wave shielding film is described with reference to the figures.

Figure 9A:
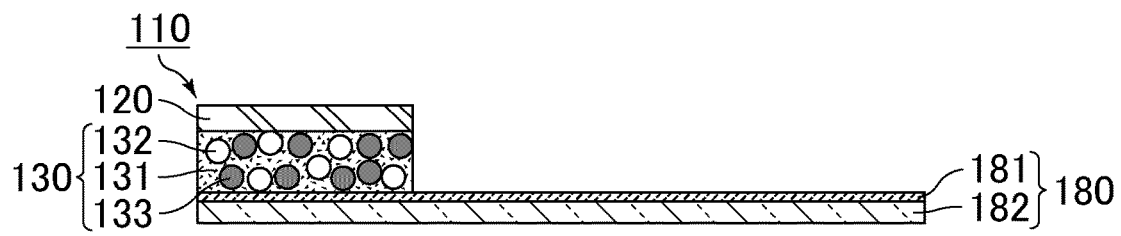
FIG. 9A is a schematic view showing that the ground member according to the second embodiment of the present invention is disposed on an electromagnetic wave shielding film.
Figure 9B:
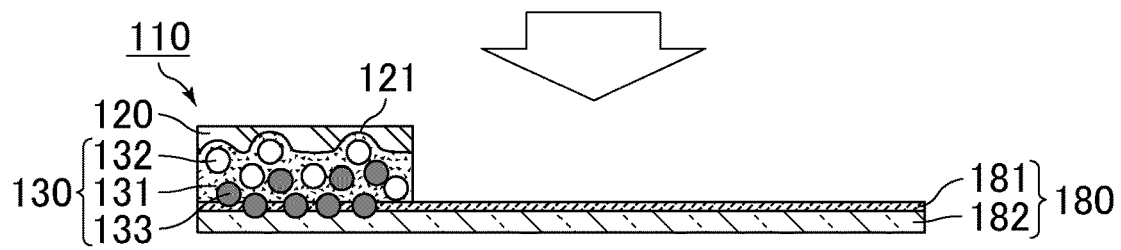
FIG. 9B is a schematic view showing that the ground member according to the second embodiment of the present invention is disposed on an electromagnetic wave shielding film.

FIG. 9A and FIG. 9B are schematic views showing that the ground member according to the second embodiment of the present invention is disposed on an electromagnetic wave shielding film.

As shown in FIG. 9A, an electromagnetic wave shielding film 180 on which the ground member 110 is to be disposed includes a protective layer 181 and a shielding layer 182 stacked on the protective layer 181.

The ground member 110 is disposed on the electromagnetic wave shielding film 180 in a manner that the protective layer 181 of the electromagnetic wave shielding film 180 is in contact with the adhesive layer 130 of the ground member 110.

Then, as shown in FIG. 9B, the conductive particles 133 of the ground member 110 are pressurized so as to penetrate the protective layer 181 of the electromagnetic wave shielding film 180.

Here, the hard particles 132 contained in the adhesive layer 130 of the ground member 110 form in the conductive layer 120 pores and hollows 121 which volatile components can pass through.

The conductive layer 120 of the ground member 110 is to be connected to an external ground (not shown), and the shielding layer 182 of the electromagnetic wave shielding film 180 is to be electrically connected to a ground circuit (not shown) of a printed wiring board.

Thus, use of the ground member 110 can electrically connect a ground circuit of a printed wiring board including an electromagnetic wave shielding film to an external ground.

In such a case, in the ground member 110, the binder component 131 in the adhesive layer 130 preferably has a thickness smaller than the average particle size of the conductive particles 133.

In the adhesive layer 130, a binder component 131 having a thickness smaller than the average particle size of the conductive particles 133 can allow the conductive particles 133 to surely penetrate the protective layer 181 of the electromagnetic wave shielding film 180 and thereby to be in contact with the shielding layer 182 of the electromagnetic wave shielding film 180.

The protective layer 181 and the shielding layer 182 constituting the electromagnetic wave shielding film 180 may be conventional products.

The ground member 110 may be disposed on a shielded printed wiring board.

Such a case of disposing the ground member 110 on a shielded printed wiring board is described with reference to the figures.

Figure 10A:
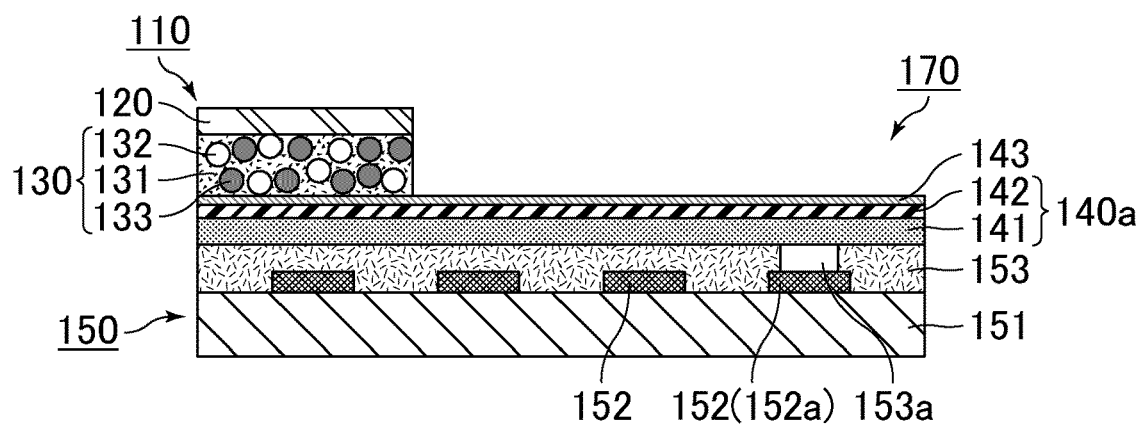
FIG. 10A is a schematic view showing that the ground member according to the second embodiment of the present invention is disposed on a shielded printed wiring board.
Figure 10B:
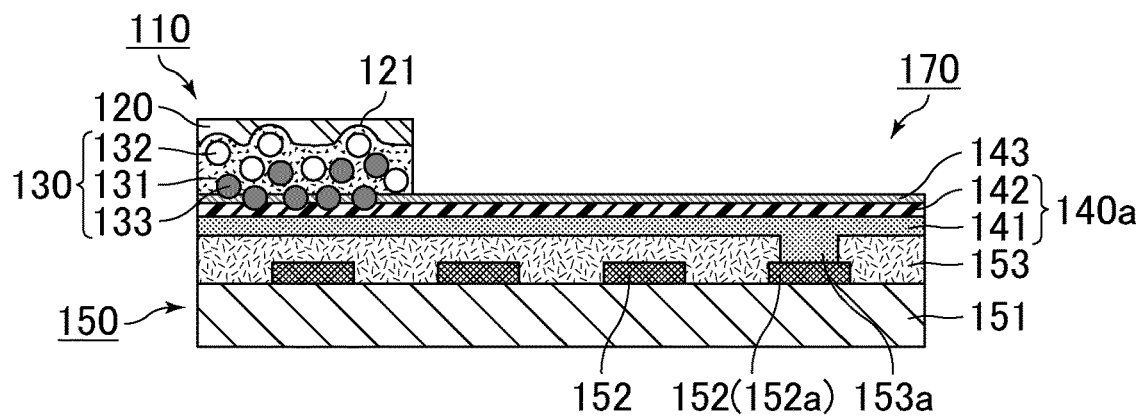
FIG. 10B is a schematic view showing that the ground member according to the second embodiment of the present invention is disposed on a shielded printed wiring board.

FIG. 10A and FIG. 10B are schematic views showing that the ground member according to the second embodiment of the present invention is disposed on a shielded printed wiring board.

As shown in FIG. 10A, a shielded printed wiring board 170 on which the ground member 110 is to be disposed includes: a printed wiring board 150 including a base film 151, printed circuits 152 including a ground circuit 152a and being disposed on the base film 151, and a coverlay 153 covering the printed circuits 152; a shielding layer 140a formed on the coverlay 153; and a protective layer 143 formed on the shielding layer 140a.

The coverlay 153 of the printed wiring board 150 has an opening 153a through which the ground circuit 152a is exposed.

Also, the shielding layer 140a includes a conductive adhesive layer 141 and a metal thin film 142 stacked on the conductive adhesive layer 141.

The shielding layer 140a is disposed on the printed wiring board 150 in a manner that the conductive adhesive layer 141 is in contact with the coverlay 153.

Then, the conductive adhesive layer 141 fills the opening 153a of the coverlay 153 and is thereby in contact with the ground circuit 152a.

As shown in FIG. 10A, the ground member 110 is disposed on the shielded printed wiring board 170 in a manner that the adhesive layer 130 is in contact with the protective layer 143.

Then, as shown in FIG. 10B, the conductive particles 133 of the ground member 110 are pressurized so as to penetrate the protective layer 143. Thereby, the conductive particles 133 are in contact with the metal thin film 142.

Here, the hard particles 132 contained in the adhesive layer 130 of the ground member 110 form in the conductive layer 120 the pores and hollows 121 which volatile components can pass through.

Also, the conductive layer 120 of the ground member 110 is to be connected to an external ground (not shown).

Thus, use of the ground member 110 can electrically connect the ground circuit 152a of the shielded printed wiring board 170 to an external ground.

In such a case, in the ground member 110, the binder component 131 in the adhesive layer 130 preferably has a thickness smaller than the average particle size of the conductive particles 133.

In the adhesive layer 130, a binder component 131 having a thickness smaller than the average particle size of the conductive particles 133 can allow the conductive particles 133 to surely penetrate the protective layer 143 and thereby to be in contact with the metal thin film 142.

Preferred materials or the like for the base film 151, the printed circuits 152 (the ground circuit 152a), the coverlay 153, the conductive adhesive layer 141, and the metal thin film 142 in the shielded printed wiring board 170 are the same as the preferred materials or the like for the base film 51, the printed circuits 52 (the ground circuit 52a), the coverlay 53, the conductive adhesive layer 41, and the metal thin film 42 in the shielded printed wiring board 70.

A preferred material for the protective layer 143 in the shielded printed wiring board 170 is engineering plastic. Examples of the engineering plastic include resins such as polyethylene terephthalate, polypropylene, cross-linked polyethylene, polyester, polybenzimidazole, polyimide, polyimide amide, polyether imide, and polyphenylene sulfide.

Among these engineering plastics, a polyphenylene sulfide film is preferred for demand for flame retardancy, and a polyimide film is preferred for demand for heat resistance.

Third Embodiment

Hereinbelow, a ground member according to a third embodiment of the present invention is described with reference to the figures.

Figure 11:
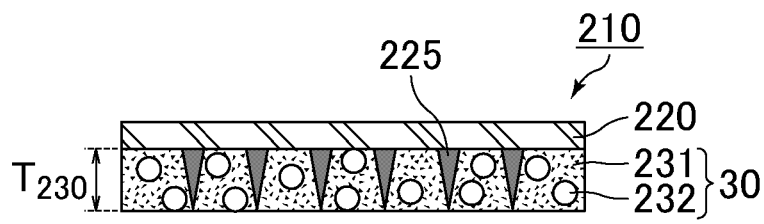
FIG. 11 is a schematic cross-sectional view showing an exemplary ground member according to a third embodiment of the present invention.

FIG. 11 is a schematic cross-sectional view showing an exemplary ground member according to a third embodiment of the present invention.

A ground member 210 shown in FIG. 11 has the same structure as the ground member 10 except that conductive bumps 225 are formed.

Specifically, as shown in FIG. 11, the ground member 210 includes a conductive layer 220 and an adhesive layer 230 stacked on the conductive layer 220.

The adhesive layer 230 includes a binder component 231 and hard particles 232.

The adhesive layer 230 has a thickness T230 of 5 to 30 μm.

The adhesive layer 230 has insulation properties.

The conductive layer 220 has the conductive bumps 225 on a side facing the adhesive layer 230.

The ground member 210 having the conductive bumps 225 can electrically connect the conductive layer 220 to an adherend via the conductive bumps 225.

The conductive bumps 225 may have any height, preferably 10 to 40 μm, more preferably 20 to 30 μm.

Conductive bumps having a height of lower than 10 μm are less likely to penetrate the protective layer of the later-described shielded printed wiring board.

Conductive bumps having a height of higher than 40 μm cause difficulty in handling.

The conductive bumps 225 may be formed from any conductive material and may be formed from a conductive paste including a resin composition and a conductive filler.

Non-limiting examples of the conductive paste include thermoplastic resin compositions such as a styrene-based resin composition, a vinyl acetate-based resin composition, a polyester-based resin composition, a polyethylene-based resin composition, a polypropylene-based resin composition, an imide-based resin composition, an amide-based resin composition, and an acrylic resin composition and heat-curable resin compositions such as a phenol-based resin composition, an epoxy-based resin composition, a urethane-based resin composition, a melamine-based resin composition, and an alkyd-based resin composition.

One of these compositions or a combination of two or more thereof may be used for the material for the resin composition.

Non-limiting examples of the conductive filler made of a conductive paste include fine metal particles, carbon nanotubes, carbon fibers, and metal fibers.

When the conductive filler is in the form of fine metal particles, non-limiting examples of the fine metal particles include silver powder, copper powder, nickel powder, solder powder, aluminum powder, silver-coated copper powder (silver-plated copper powder), and fine particles such as fine polymer particles and glass beads coated with metal.

In terms of economic efficiency, preferred among these is copper powder or silver-plated copper powder which is available at low costs.

The ground member 210 may be disposed on a shielded printed wiring board.

Such a case of disposing the ground member 210 on a shielded printed wiring board is described with reference to the figures.

Figure 12A:
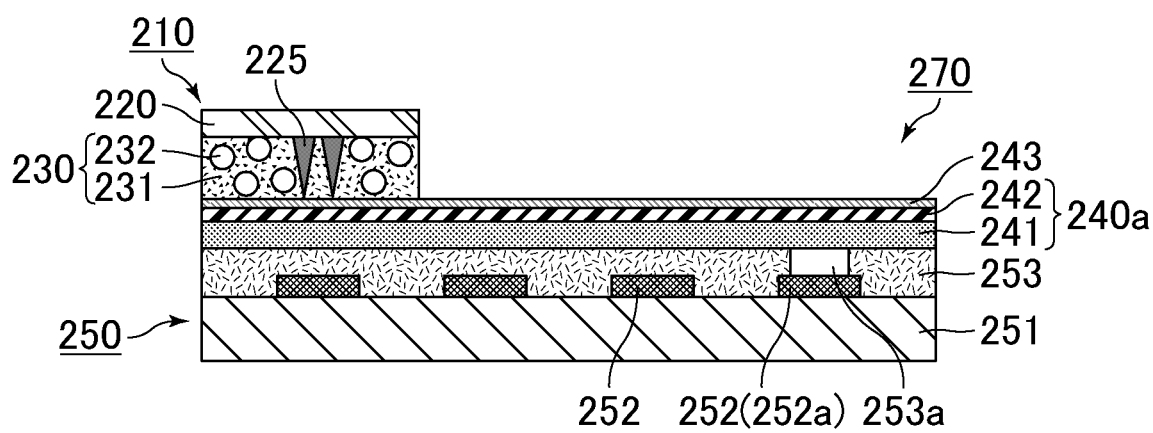
FIG. 12A is a schematic view showing that the ground member according to the third embodiment of the present invention is disposed on a shielded printed wiring board.
Figure 12B:
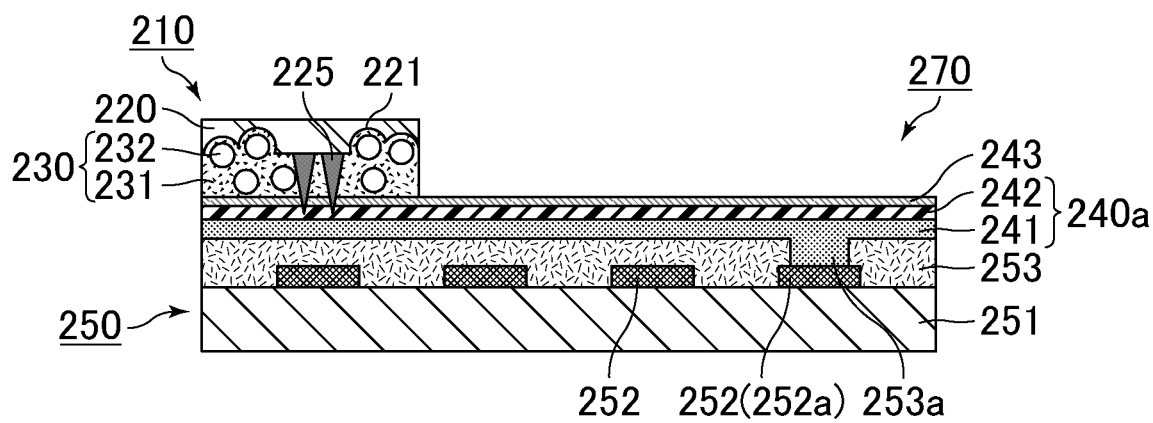
FIG. 12B is a schematic view showing that the ground member according to the third embodiment of the present invention is disposed on a shielded printed wiring board.

FIG. 12A and FIG. 12B are schematic views showing that the ground member according to the third embodiment of the present invention is disposed on a shielded printed wiring board.

As shown in FIG. 12A, a shielded printed wiring board 270 on which the ground member 210 is to be disposed includes: a printed wiring board 250 including a base film 251, printed circuits 252 including a ground circuit 252a and being disposed on the base film 251, and a coverlay 253 covering the printed circuits 252; a shielding layer 240a formed on the coverlay 253; and a protective layer 243 formed on the shielding layer 240a.

The coverlay 253 of the printed wiring board 250 has an opening 253a through which the ground circuit 252a is exposed.

Also, the shielding layer 240a includes a conductive adhesive layer 241 and a metal thin film 242 stacked on the conductive adhesive layer 241.

The shielding layer 240a is disposed on the printed wiring board 250 in a manner that the conductive adhesive layer 241 is in contact with the coverlay 253.

Then, the conductive adhesive layer 241 fills the opening 253a of the coverlay 253 and is thereby in contact with the ground circuit 252a.

As shown in FIG. 12A, the ground member 210 is disposed on the shielded printed wiring board 270 in a manner that the adhesive layer 230 is in contact with the protective layer 243.

Then, as shown in FIG. 12B, the conductive bumps 225 of the ground member 210 are pressurized so as to penetrate the protective layer 243. Thereby, the conductive bumps 225 are in contact with the metal thin film 242. In other words, the conductive bumps 225 of the ground member 210 not only penetrate the protective layer 243 but also are electrically connected to the conductive layer 220 of the ground member 210 and the shielding layer 240a.

Here, the hard particles 232 contained in the adhesive layer 230 of the ground member 210 form in the conductive layer 220 pores and hollows 221 which volatile components can pass through.

Also, the conductive layer 220 of the ground member 210 is to be connected to an external ground (not shown).

Thus, use of the ground member 210 can electrically connect the ground circuit 252a of the shielded printed wiring board 270 to an external ground.

Next, a shielded printed wiring board including the ground member 210 of another embodiment is described with reference to the figures.

FIG. 13A, FIG. 13B, FIG. 13C, and FIG. 13D are schematic views showing that the ground member according to the third embodiment of the present invention is disposed on a shielded printed wiring board.

Figure 13A:
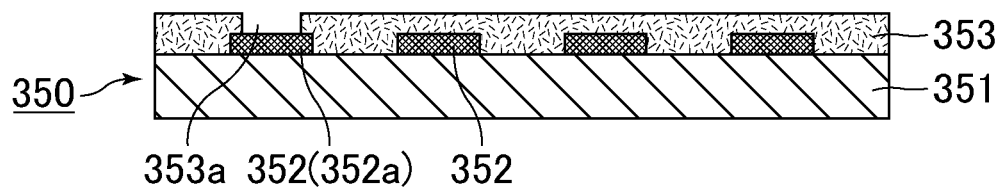
FIG. 13A is a schematic view showing that the ground member according to the third embodiment of the present invention is disposed on a shielded printed wiring board.

First, as shown in FIG. 13A, a printed wiring board 350 including a base film 351, printed circuits 352 including a ground circuit 352a and being disposed on the base film 351, and a coverlay 353 covering the printed circuits 352 is prepared.

In the printed wiring board 350, part of the ground circuit 352a is exposed through an opening 353a of the coverlay 353.

Figure 13B:
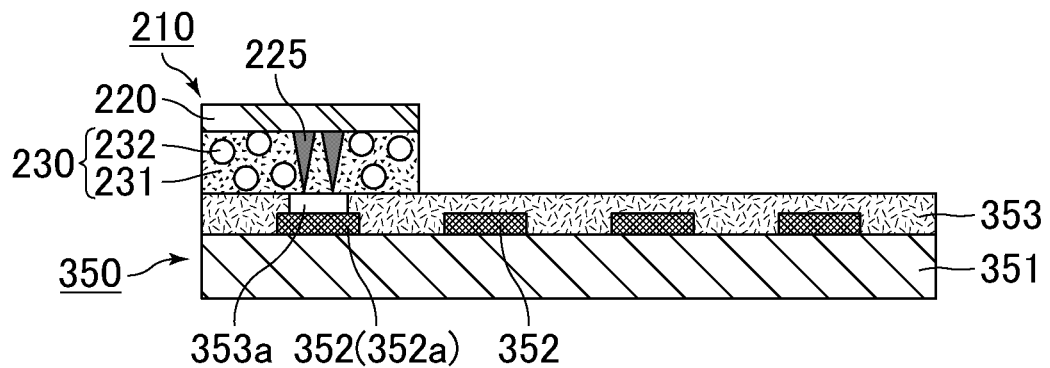
FIG. 13B is a schematic view showing that the ground member according to the third embodiment of the present invention is disposed on a shielded printed wiring board.

Next, as shown in FIG. 13B, the ground member 210 is disposed on the printed wiring board 350 in a manner that the adhesive layer 230 is positioned on the opening 353a in the coverlay 353 of the printed wiring board 350.

Figure 13C:
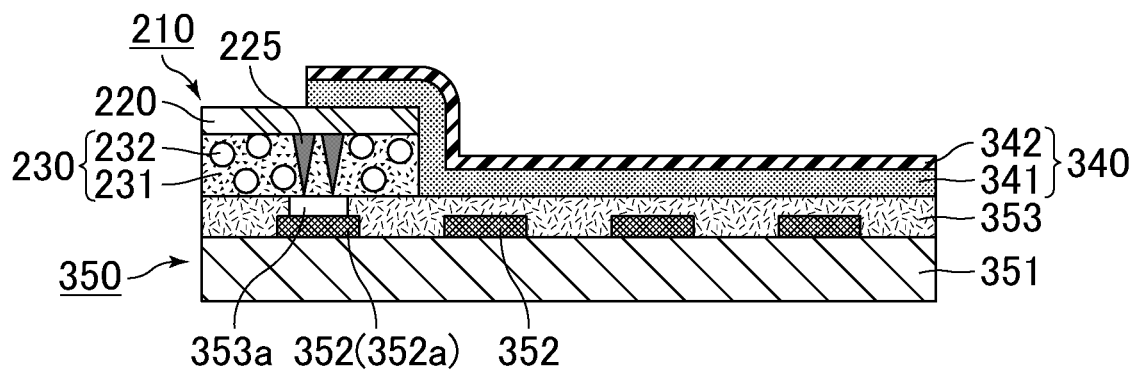
FIG. 13C is a schematic view showing that the ground member according to the third embodiment of the present invention is disposed on a shielded printed wiring board.

Next, as shown in FIG. 13C, an electromagnetic wave shielding film 340 including a conductive adhesive layer 341 and a metal thin film 342 stacked on the conductive adhesive layer 341 is disposed on the ground member 210 and the printed wiring board 350 with the conductive adhesive layer 341 side down.

Figure 13D:
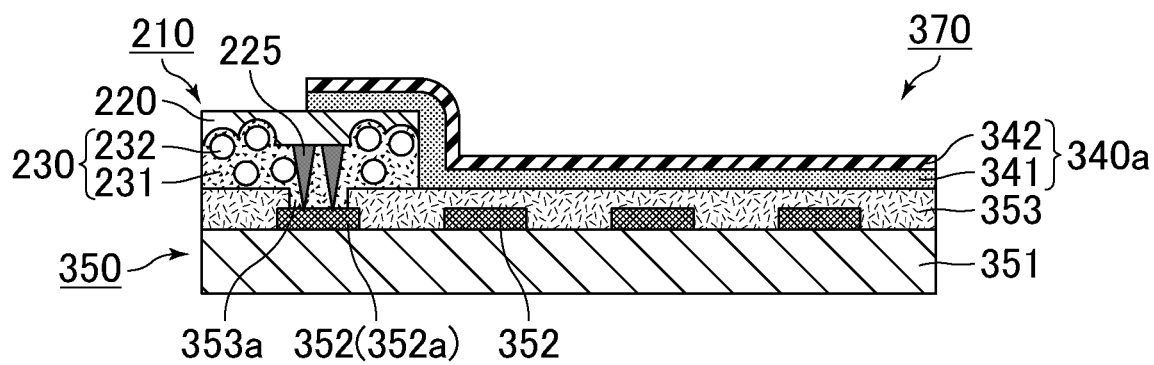
FIG. 13D is a schematic view showing that the ground member according to the third embodiment of the present invention is disposed on a shielded printed wiring board.

Next, as shown in FIG. 13D, the ground member 210 and the electromagnetic wave shielding film 340 are press bonded with the printed wiring board 350 by pressing and heating, whereby a shielded printed wiring board 370 is produced.

Here, the conductive bumps 225 of the ground member 210 penetrate the adhesive layer 230 to be in contact with the ground circuit 352a.

Also, the hard particles 232 contained in the adhesive layer 230 of the ground member 210 form in the conductive layer 220 the pores and hollows 221 which volatile components can pass through.

Also, the electromagnetic wave shielding film 340 serves as a shielding layer 340a.

Moreover, the conductive adhesive layer 341 of the shielding layer 340a is in contact with the conductive layer 220 of the ground member 210.

The conductive layer 220 of the ground member 210 is to be connected to an external ground (not shown).

Thus, use of the ground member 210 can electrically connect the ground circuit 352a of the shielded printed wiring board 370 to an external ground.

Preferred materials or the like for the base film 351, the printed circuits 352 (the ground circuit 352a), the coverlay 353, the conductive adhesive layer 341, and the metal thin film 342 in the shielded printed wiring board 370 are the same as the preferred materials or the like for the base film 51, the printed circuits 52 (the ground circuit 52a), the coverlay 53, the conductive adhesive layer 41, and the metal thin film 42 in the shielded printed wiring board 70.

REFERENCE SIGNS LIST 10, 110, 210, 510 ground member
20, 120, 220, 520 conductive layer
21, 121, 221 pore or hollow
30, 130, 230, 530 adhesive layer
31, 131, 231 binder component
32, 132, 232 hard particles
40, 180, 340 electromagnetic wave shielding film
40a, 140a, 182, 240a, 340a shielding layer
41, 141, 241, 341 conductive adhesive layer 42, 142, 242, 342 metal thin film
50, 150, 250, 350, 550 printed wiring board
51, 151, 251, 351, 551 base film
52, 152, 252, 352, 552 printed circuit
52a, 152a, 252a, 352a ground circuit
53, 153, 253, 353, 553 coverlay
53a, 153a, 253a, 353a opening
60, 560 volatile component
70, 170, 270, 370 shielded printed wiring board
133 conductive particle
143, 181, 243 protective layer
255 conductive bump

The invention claimed is:

1. A ground member, comprising:
a conductive layer having a thickness of 1 to 9 μm; and
an adhesive layer stacked on the conductive layer,
the adhesive layer containing a binder component and hard particles and the adhesive layer having a thickness of 5 to 30 μm,
wherein the hard particles are embedded in the conductive layer, and
the conductive layer has pores and/or hollows formed by the embedded hard particles through which volatile components can pass.

2. The ground member according to claim 1, wherein the hard particles have a Mohs hardness value 1.5 times or more higher than the conductive layer.

3. The ground member according to claim 1, wherein the hard particles have a Mohs hardness value of 4 to 7.

4. The ground member according to claim 1, wherein the hard particles have an average particle size of 2.5 to 25 μm.

5. The ground member according to claim 1, wherein the hard particles contain silica.

6. The ground member according to claim 1, wherein the conductive layer contains at least one selected from the group consisting of copper, silver, gold, and nickel.

7. The ground member according to claim 1, wherein the adhesive layer further contains conductive particles.

8. The ground member according to claim 7, wherein the hard particles have a smaller average particle size than the conductive particles.

9. The ground member according to claim 7, wherein the hard particles have a higher Mohs hardness value than the conductive particles.

10. The ground member according to claim 7, wherein the binder component in the adhesive layer has a thickness smaller than the average particle size of the conductive particles.

11. The ground member according to claim 7, wherein the ground member is to be disposed on an electromagnetic wave shielding film including a protective layer and a shielding layer stacked on the protective layer in a manner that the adhesive layer is in contact with the protective layer and the conductive particles penetrate the protective layer.

12. The ground member according to claim 7, wherein the ground member is to be disposed on a shielded printed wiring board that includes: a printed wiring board including a base film, a printed circuit including a ground circuit and being disposed on the base film, and a coverlay covering the printed circuit; a shielding layer being disposed on the coverlay and being electrically connected to the ground circuit; and a protective layer being disposed on a surface opposite a printed circuit side surface of the shielding layer, and the ground member is to be disposed in a manner that the adhesive layer is in contact with the protective layer and the conductive particles penetrate the protective layer.

13. A shielded printed wiring board, comprising:
a printed wiring board including a base film, a printed circuit including a ground circuit and being disposed on the base film, and a coverlay covering the printed circuit;
a shielding layer being disposed on the coverlay and being electrically connected to the ground circuit; and
a protective layer disposed on a surface opposite a printed circuit side surface of the shielding layer,
the shielded printed wiring board further including the ground member according claim 7,
the ground member being disposed in a manner that the adhesive layer of the ground member is in contact with the protective layer,
the conductive particles of the ground member penetrating the protective layer and being electrically connected to the conductive layer of the ground member and the shielding layer.

14. The ground member according to claim 1,
wherein the adhesive layer has insulation properties, and
the conductive layer has one or more conductive bumps on a side facing the adhesive layer.

15. A shielded printed wiring board, comprising:
a printed wiring board including a base film, a printed circuit including a ground circuit and being disposed on the base film, and a coverlay covering the printed circuit;
a shielding layer being disposed on the coverlay and being electrically connected to the ground circuit; and
a protective layer disposed on a surface opposite a printed circuit side surface of the shielding layer,
the shielded printed wiring board further including the ground member according to claim 13,
the ground member being disposed in a manner that the adhesive layer of the ground member is in contact with the protective layer,
the one or more conductive bumps of the ground member penetrating the protective layer and being electrically connected to the conductive layer of the ground member and the shielding layer.

16. A shielded printed wiring board, comprising:
a printed wiring board including a base film, a printed circuit including a ground circuit and being disposed on the base film, and a coverlay covering the printed circuit; and
a shielding layer being disposed on the coverlay and being electrically connected to the ground circuit,
the shielded printed wiring board further including a ground member comprising a conductive layer and an adhesive layer stacked on the conductive layer, with the adhesive layer containing a binder component and hard particles and the adhesive layer having a thickness of 5 to 30 μm,
the ground member being disposed in a manner that the adhesive layer of the ground member is in contact with the coverlay,
the conductive layer of the ground member and the shielding layer being electrically connected to each other.

17. A shielded printed wiring board, comprising:
a printed wiring board including a base film, a printed circuit including a ground circuit and being disposed on the base film, and a coverlay covering the printed circuit; and
an electromagnetic wave shielding film being disposed on the coverlay and including a conductive adhesive layer and a shielding layer stacked on the conductive adhesive layer, the conductive adhesive layer being electrically connected to the ground circuit,
the shielded printed wiring board further including a ground member comprising a conductive layer and an adhesive layer stacked on the conductive layer, with the adhesive layer containing a binder component and hard particles and the adhesive layer having a thickness of 5 to 30 μm,
the ground member being disposed in a manner that the adhesive layer of the ground member is in contact with the coverlay,
the conductive layer of the ground member and the conductive adhesive layer of the electromagnetic wave shielding film being electrically connected to each other.

* * * * *